US012660714B2

(12) United States Patent
Yoon et al.

(10) Patent No.: US 12,660,714 B2
(45) Date of Patent: Jun. 16, 2026

(54) SEMICONDUCTOR PACKAGE INCLUDING CONNECTION OF DUMMY PAD AND TEST PAD

(71) Applicant: Samsung Electronics Co., Ltd., Suwon-si (KR)

(72) Inventors: Youngjun Yoon, Suwon-si (KR); Yunseok Choi, Suwon-si (KR); Jongpa Hong, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 382 days.

(21) Appl. No.: 18/454,278

(22) Filed: Aug. 23, 2023

(65) Prior Publication Data

US 2024/0222330 A1 Jul. 4, 2024

(30) Foreign Application Priority Data

Jan. 4, 2023 (KR) ........................ 10-2023-0001342

(51) Int. Cl.
*H01L 25/065* (2023.01)
*H01L 23/00* (2006.01)

(52) U.S. Cl.
CPC .......... *H01L 25/0657* (2013.01); *H01L 24/16* (2013.01); *H01L 24/17* (2013.01);
(Continued)

(58) Field of Classification Search
CPC ..... H01L 25/0657; H01L 24/16; H01L 24/17; H01L 24/32; H01L 24/73; H01L 2224/16148; H01L 2224/1703; H01L 2224/17051; H01L 2224/17136; H01L 2224/17517; H01L 2224/32146; H01L 2224/73204; H01L 2225/06513; H01L 2225/06544; H01L 2924/2064; H01L 24/11; H01L 2225/06517;
(Continued)

(56) References Cited

U.S. PATENT DOCUMENTS 9,721,926 B2 8/2017 Choe et al.
10,096,540 B2 10/2018 Lee et al.
(Continued)

FOREIGN PATENT DOCUMENTS

JP 5328837 B2 10/2013

*Primary Examiner* — J. E. Schoenholtz
(74) *Attorney, Agent, or Firm* — Harness, Dickey & Pierce, P.L.C.

(57) ABSTRACT

A semiconductor package includes a first semiconductor chip including first front connection pads on a first front surface, first rear connection pads and dummy pads on a first rear surface, and through-electrodes. The package includes a second semiconductor chip including second front connection pads and test pads on a second front surface, and a protective layer including openings exposing at least a portion of the second front connection pads and the test pads. The package includes bump structures electrically connecting the first rear connection pads and the second front connection pads, and an adhesive film surrounding at least a portion of each of the first rear connection pads, the dummy pads, and the bump structures. The dummy pads overlap the test pads in a direction perpendicular to the first rear surface, and a height of the dummy pads is greater than a height of the first rear connection pads.

20 Claims, 17 Drawing Sheets

(52) U.S. Cl.
CPC .............. *H01L 24/32* (2013.01); *H01L 24/73*
(2013.01); *H01L 2224/16148* (2013.01); *H01L*
*2224/1703* (2013.01); *H01L 2224/17051*
(2013.01); *H01L 2224/17136* (2013.01); *H01L*
*2224/17517* (2013.01); *H01L 2224/32146*
(2013.01); *H01L 2224/73204* (2013.01); *H01L*
*2225/06513* (2013.01); *H01L 2225/06544*
(2013.01); *H01L 2924/2064* (2013.01)

(58) Field of Classification Search
CPC . H01L 2225/06541; H01L 2225/06596; H01L
24/13; H01L 24/14; H01L 24/81; H01L
24/92; H01L 25/0652; H01L 25/50; H01L
22/32; H01L 23/3171; H01L 24/09; H01L
25/18; H01L 2225/06527
See application file for complete search history.

(56) References Cited

U.S. PATENT DOCUMENTS

| | | | |
|---|---|---|---|
| 11,335,668 B2 | 5/2022 | Oh et al. | |
| 11,342,310 B2 | 5/2022 | Choi et al. | |
| 2014/0252572 A1 | 9/2014 | Hou et al. | |
| 2015/0123268 A1 | 5/2015 | Yu et al. | |
| 2021/0134761 A1* | 5/2021 | Oh | H01L 21/565 |
| 2021/0305190 A1* | 9/2021 | Choi | H01L 24/14 |
| 2021/0384044 A1 | 12/2021 | Tsai et al. | |
| 2023/0038603 A1* | 2/2023 | Choi | H01L 24/06 |
| 2023/0060360 A1* | 3/2023 | Seo | H01L 24/05 |
| 2023/0387083 A1* | 11/2023 | Oh | H01L 22/12 |
| 2024/0304466 A1* | 9/2024 | Tsai | H01L 25/0652 |

* cited by examiner

A

1000a

A

1000b

SEMICONDUCTOR PACKAGE INCLUDING CONNECTION OF DUMMY PAD AND TEST PAD

CROSS-REFERENCE TO RELATED APPLICATION

This application claims the benefit of priority to Korean Patent Application No. 10-2023-0001342 filed on Jan. 4, 2023 in the Korean Intellectual Property Office, the disclosure of which is incorporated herein by reference in its entirety.

FIELD

The inventive concepts relate to a semiconductor package.

BACKGROUND

As electronic devices become lighter and higher-performance, the development of miniaturized and high-performance semiconductor packages is also desired or required in the field of semiconductor packages. In order to realize miniaturization, lightweightedness, high performance, and high reliability of semiconductor packages, research and development has been continuously conducted on a semiconductor package in which a plurality of semiconductor chips may be stacked.

SUMMARY

An example embodiment of the inventive concepts is to provides a semiconductor package having improved reliability.

According to an example embodiment of the inventive concepts, a semiconductor package includes a first semiconductor chip including a first front surface and a first rear surface opposite to each other, the first semiconductor chip including first front connection pads on the first front surface, first rear connection pads and dummy pads adjacent to each other on the first rear surface, and through-electrodes electrically connecting at least some of the first front connection pads with at least some of the first rear connection pads. The package includes a second semiconductor chip including a second front surface facing the first rear surface, the second semiconductor chip including second front connection pads and test pads adjacent to each other on the second front surface, and a protective layer including openings exposing at least a portion of each of the second front connection pads and the test pads. The package includes bump structures between the first semiconductor chip and the second semiconductor chip, the bump structures electrically connecting the first rear connection pads and the second front connection pads, and an adhesive film surrounding at least a portion of each of the first rear connection pads, at least a portion of each of the dummy pads, and at least a portion of each of the bump structures, the adhesive film between the first semiconductor chip and the second semiconductor chip. The dummy pads overlap the test pads in a direction perpendicular to the first rear surface, and a height of the dummy pads is greater than a height of the first rear connection pads.

According to an example embodiment of the inventive concepts, a semiconductor package includes a first semiconductor chip including first rear connection pads, dummy pads adjacent to at least some of the first rear connection pads, and through-electrodes electrically connected to the first rear connection pads, a second semiconductor chip on the first semiconductor chip, the second semiconductor chip including second front connection pads facing the first rear connection pads, and test pads facing the dummy pads, bump structures electrically connecting the first rear connection pads and the second front connection pads, and an adhesive film filling a space between the first semiconductor chip and the second semiconductor chip, wherein an interval between each of the dummy pads and each of the test pads facing each other, is shorter than an interval between each of the first rear connection pads and each of the second front connection pads facing each other.

According to an example embodiment of the inventive concepts, a semiconductor package includes a first semiconductor chip including first rear connection pads, dummy pads adjacent to at least some of the first rear connection pads, and through-electrodes electrically connected to the first rear connection pads, a second semiconductor chip on the first semiconductor chip, the second semiconductor chip including second front connection pads facing the first rear connection pads, and test pads facing the dummy pads, bump structures electrically connecting the first rear connection pads and the second front connection pads facing each other, and an adhesive film surrounding at least a portion of each of the dummy pads and at least a portion of each of the bump structures, the adhesive film between the first semiconductor chip and the second semiconductor chip, wherein upper surfaces of the dummy pads are higher than upper surfaces of the first rear connection pads.

BRIEF DESCRIPTION OF DRAWINGS

The above and other features and advantages of the inventive concepts will be more clearly understood from the following detailed description, taken in conjunction with the accompanying drawings, in which.

DETAILED DESCRIPTION

Hereinafter, some example embodiments will be described with reference to the accompanying drawings.

Figure 1A:
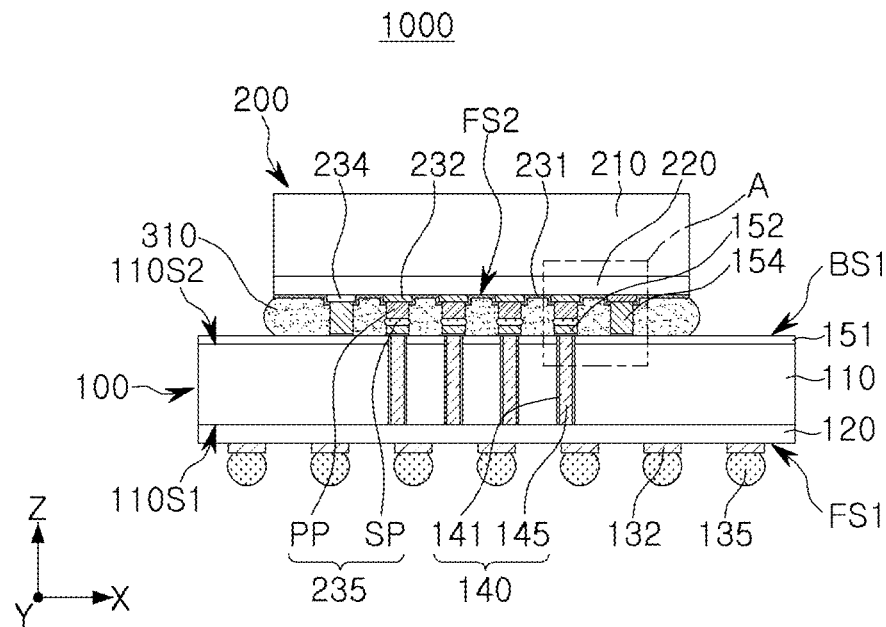
FIG. 1A is a cross-sectional view of a semiconductor package according to an example embodiment.
Figure 1B:
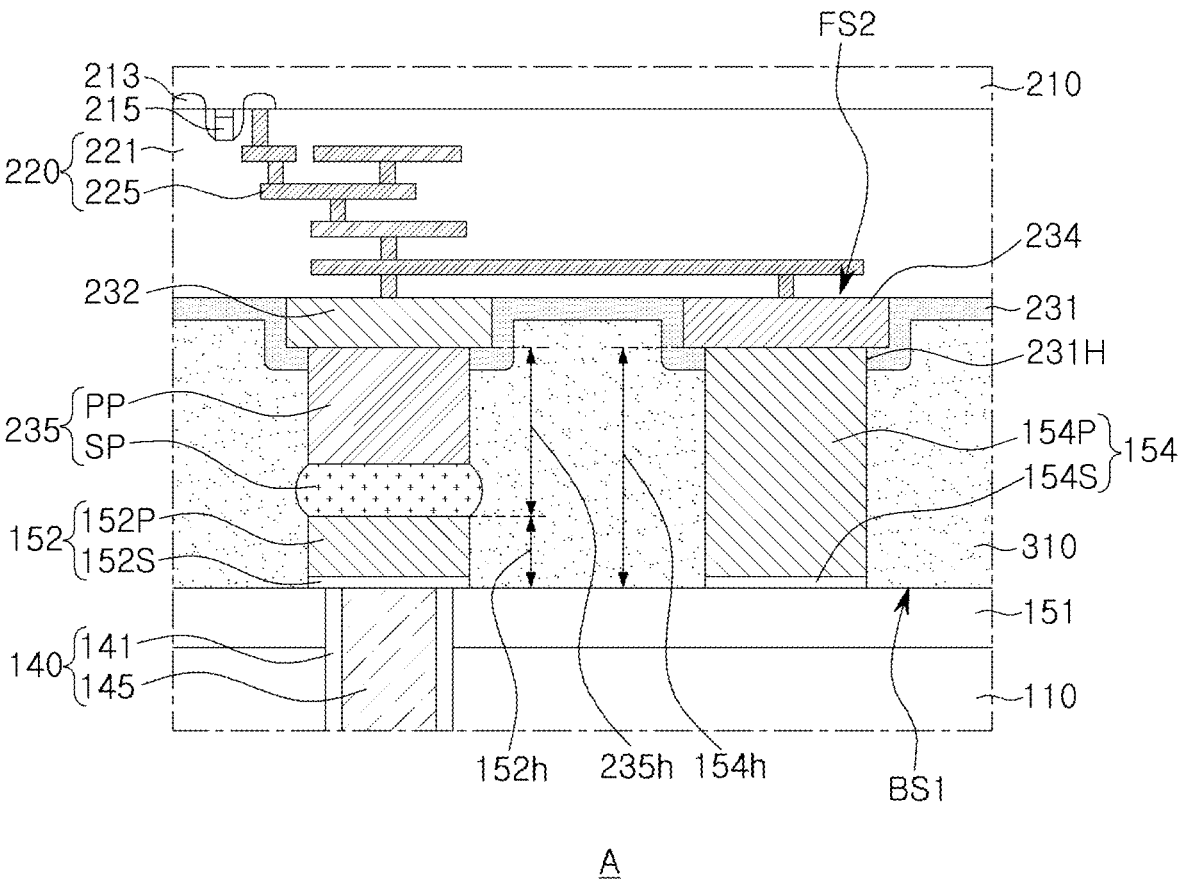
FIG. 1B is a partially enlarged view illustrating portion 'A' of FIG. 1A.
Figure 1C:
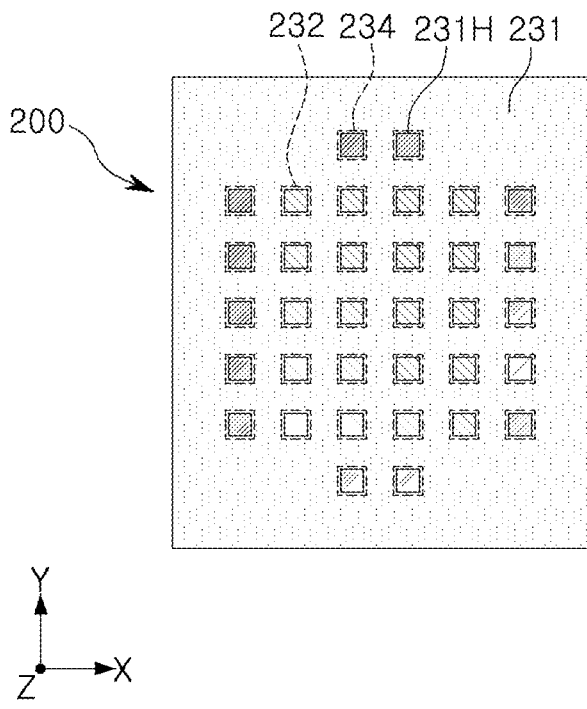
FIG. 1C is a bottom view illustrating a front surface of the second semiconductor chip of FIG. 1A.
Figure 1D:
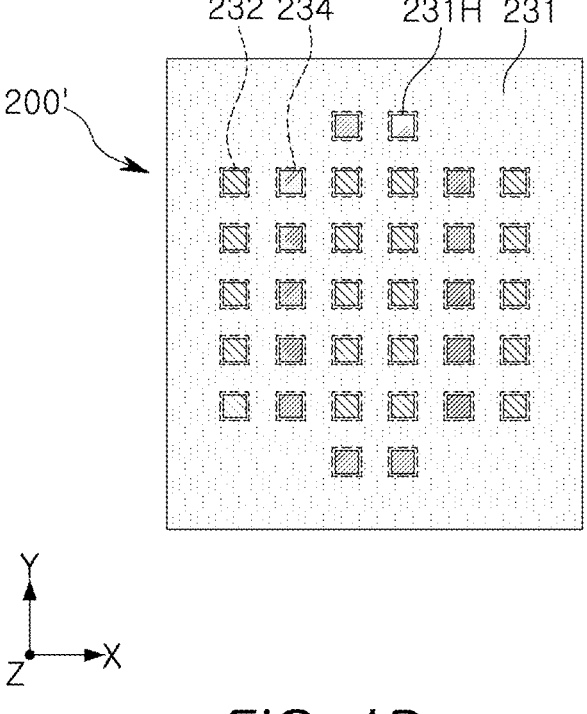
FIG. 1D is a bottom view illustrating a front surface of a second semiconductor chip of a modified example embodiment.

FIG. 1A is a cross-sectional view of a semiconductor package 1000 according to an example embodiment, FIG. 1B is a partially enlarged view illustrating portion 'A' of FIG. 1A, FIG. 1C is a bottom view illustrating a front surface of the second semiconductor chip 200 of FIG. 1A, and FIG. 1D is a bottom view illustrating a front surface of a second semiconductor chip 200' of a modified example embodiment.

Referring to FIGS. 1A to 1D, a semiconductor package 1000 according to an example embodiment may include a plurality of semiconductor chips 100 and 200 stacked in a vertical direction (e.g., a Z-direction), bump structures 235 electrically connecting the plurality of semiconductor chips 100 and 200, and an adhesive film 310 fixing and supporting the plurality of semiconductor chips 100 and 200. For example, the semiconductor package 1000 may include a first semiconductor chip 100 and a second semiconductor chip 200 stacked on the first semiconductor chip 100, but the number of stacked semiconductor chips is not limited thereto.

In some example embodiments of the inventive concepts, dummy pads 154 adjacent to the bump structures 235 may be located at positions corresponding to an electrical die sorting (EDS) test pad (hereinafter referred to as "a test pad 234"), which is difficult to form the bump structures 235, to control flow of the adhesive film 310 and reduce or prevent a short circuit between the bump structures 235 during a heat-compression bonding process. The dummy pads 154 may be formed to have desired (or alternatively, predetermined) positions and heights to effectively control the flow of the adhesive film 310. For example, the dummy pads 154 may overlap the test pads 234 in the vertical direction (e.g., the Z-direction), and may have a height 154h, greater than a height 152h of a first rear connection pad 152 adjacent thereto. Also, an interval between the dummy pads 154 and the test pads 234, facing each other, may be shorter than an interval between first rear connection pads 152 and second front connection pads 232, facing each other. In addition, upper surfaces of the dummy pads 154 may be located on a level, higher than a boundary surface between a pillar portion PP and a solder portion SP of the bump structures 235.

The first semiconductor chip 100 has a first front surface FS1 and a first rear surface BS1, opposite to each other, and may include a first substrate 110, a first circuit layer 120, through-electrodes 140, a plurality of connection pads 132 and 152, and dummy pads 154. The second semiconductor chip 200 may be disposed on the first rear surface BS1 of the first semiconductor chip 100, and a plurality of connection bumps 135 may be disposed on the first front surface FS1.

The first substrate 110 may include, for example, a semiconductor element such as silicon or germanium (Ge), or may include a compound semiconductor such as silicon carbide (SiC), gallium arsenide (GaAs), indium arsenide (InAs), or indium phosphide (InP), but example embodiments are not limited thereto. The first circuit layer 120 may be disposed on an active surface 110S1 of the first substrate 110, and a first rear surface insulating layer 151 may be disposed on a non-active surface 110S2 of the first substrate 110.

Since the first circuit layer 120 and the first substrate 110 have the same or similar characteristics as a second circuit layer 220 and a second substrate 210 of the second semiconductor chip 200, to be described later, detailed descriptions of the first circuit layer 120 and the first substrate 110 may be replaced with descriptions of the second circuit layer 220 and the second substrate 210, illustrated in FIG. 1B.

The first rear surface insulating layer 151 may be disposed on the non-active surface 110S2 of the first substrate 110. The first rear surface insulating layer 151 may be formed to surround upper portions of the through-electrodes 140. The first rear surface insulating layer 151 may electrically insulate the first rear connection pads 152 and the dummy pads 154, from a semiconductor material forming the first substrate 110. The first rear surface insulating layer 151 may include silicon oxide, silicon oxynitride, silicon nitride, a polymer, or a combination thereof, but example embodiments are not limited thereto. The first rear surface insulating layer 151 may be formed using a chemical vapor deposition (CVD) process, a flowable-CVD process, or a spin coating process, but example embodiments are not limited thereto.

The through-electrodes 140 may pass through the first substrate 110, and may electrically connect at least a portion of first front connection pads 132 and at least a portion of first rear connection pads 152. The through-electrodes 140 may include a via plug 145 and a side surface barrier film 141 surrounding a side surface of the via plug 145. The via plug 145 may include, for example, tungsten (W), titanium (Ti), aluminum (Al), or copper (Cu), and may be formed by a plating process, a PVD process, or a CVD process, but example embodiments are not limited thereto. The side surface barrier film 141 may include titanium (Ti), titanium nitride (TiN), tantalum (Ta), or tantalum nitride (TaN), and may be formed by a plating process, a PVD process, or a CVD process, but example embodiments are not limited thereto. A side surface insulating film (not illustrated) including an insulating material such as silicon oxide, silicon nitride, or silicon oxynitride (e.g., a high aspect ratio process (HARP) oxide) may be formed between the side surface barrier film 141 and the first substrate 110.

The plurality of connection pads 132 and 152 may include the first front connection pads 132 disposed on the first front surface FS1, and the first rear connection pads 152 disposed on the first rear surface BS1. The first front connection pads 132 and the first rear connection pads 152 may be formed of, for example, at least one of aluminum (Al), copper (Cu), nickel (Ni), tungsten (W), platinum (Pt), or gold (Au), but example embodiments are not limited thereto. The first rear connection pads 152 may be connected to integrated circuits or individual elements (not illustrated) in the first circuit layer 120 through the through-electrodes 140, or may be connected to the first front connection pads 132. The first front connection pads 132 and the first rear connection pads 152 may include a signal pad, a power pad, and a ground pad.

The dummy pads 154 may be disposed adjacently to at least a portion of the first rear connection pads 152 on the first rear surface BS1. The dummy pads 154 may be formed of the same or similar material as the plurality of connection pads 132 and 152, for example, at least one of aluminum (Al), copper (Cu), nickel (Ni), tungsten (W), or platinum (Pt), or gold (Au), but example embodiments are not limited thereto. The dummy pads 154 and the first rear connection pads 152 may include seed layers 154S and 152S disposed on the first rear surface BS1, and plating layers 154P and 152P disposed on the seed layers 154S and 152S. Similarly, the first front connection pads 132, the second front connection pads 232, and the test pads 234 may include a seed layer (not illustrated).

The dummy pads 154 may protrude toward the test pads 234 disposed on a second front surface FS2 of the second semiconductor chip 200, to control flow of the adhesive film 310 causing a short circuit of the bump structures 235 (e.g., the solder portion SP). For example, the dummy pads 154 may be disposed to overlap the test pads 234 corresponding thereto in the stacking direction (e.g., the Z-direction) of the first semiconductor chip 100 and the second semiconductor chip 200, and may have the height 154$h$, greater than the height 152$h$ of the first rear connection pad 152 adjacent thereto. The height 154$h$ of the dummy pads 154 may be equal to or greater than a height 235$h$ of the bump structures 235. The height 154$h$ of the dummy pads 154 may be, for example, in a range of about 10 µm to about 60 µm, about 20 µm to about 50 µm, and about 25 µm to about 50 µm, but is not limited thereto.

In addition, the upper surfaces of the dummy pads 154 may be located on a level, higher than the boundary surface between the pillar portion PP and the solder portion SP of the bump structures 235. The upper surfaces of the dummy pads 154 may be in contact with the test pads 234 corresponding thereto, but example embodiments are not limited thereto. Depending on example embodiments, the upper surfaces of the dummy pads 154 may be in contact with at least one of the adhesive film 310 or the test pads 234 (e.g., see FIGS. 2A to 2C).

The plurality of connection bumps 135 may be disposed below the first front connection pads 132, and may be electrically connected to the first semiconductor chip 100 and the second semiconductor chip 200. The plurality of connection bumps 135 may include, for example, tin (Sn) or an alloy containing tin (Sn) (e.g., Sn—Ag—Cu). Depending on example embodiments, the plurality of connection bumps 135 may have a combination of a metal pillar and a solder ball. The plurality of connection bumps 135 may be electrically connected to an external device such as a package substrate, a module substrate, a system board, or the like.

The second semiconductor chip 200 may have the second front surface FS2 facing the first front surface FS1 of the first semiconductor chip 100, and may include the second substrate 210, the second circuit layer 220, the second front connection pads 232, and the test pads 234. According to an example embodiment, the second semiconductor chip 200 may further include a protective layer 231 covering the second front surface FS2.

The second substrate 210 may include a semiconductor material similar to that of the first substrate 110. The second substrate 210 may have a silicon on insulator (SOI) structure. The second substrate 210 may include a conductive region 213, for example, a well doped with impurities, a structure doped with impurities, and various device isolation structures (not illustrated) such as a shallow trench isolation (STI) structure. Individual elements 215 constituting an integrated circuit may be disposed on the active surface of the second substrate 210 on which the conductive region 213 is formed. The conductive region 213 and the individual devices 215 may be electrically connected to the second front connection pads 232 and/or the test pads 234 through an interconnection structure 225. The individual elements 215 include a field effect transistor (FET) such as a planar FET, a FinFET, or the like, a memory device such as a flash memory, a dynamic random access memory (DRAM), a static random access memory (SRAM), an electrically erasable programmable read-only memory (EEPROM), a phase-change random access memory (PRAM), a magnetoresistive random access memory (MRAM), a ferroelectric random access memory (FeRAM), a resistive random access memory (RRAM), or the like, a logic device such as AND, OR, NOT, or the like, or various active elements and/or passive elements such as a system large scale integration (LSI), a CMOS imaging sensor (CIS), or a micro-electro-mechanical system (MEMS), but example embodiments are not limited thereto.

The second circuit layer 220 may be disposed on the active surface of the second substrate 210, and may include an interlayer insulating layer 221 and an interconnection structure 225. The interlayer insulating layer 221 may include a flowable oxide (FOX), a tonen silazen (TOSZ), an undoped silica glass (USG), a borosilica glass (BSG), a phosphosilaca glass (PSG), a borophosphosilica glass (BPSG), a plasma enhanced tetra ethyl ortho silicate (PE-TEOS), a fluoride silicate glass (FSG), a high density plasma (HDP) oxide, a plasma enhanced oxide (PEOX), a flowable CVD (FCVD) oxide, or a combination thereof, but example embodiments are not limited thereto. At least a portion of the interlayer insulating layer 221 surrounding the interconnection structure 225 may be formed as a low dielectric layer. The interlayer insulating layer 221 may be formed using a chemical vapor deposition (CVD) process, a flowable-CVD process, or a spin coating process, but example embodiments are not limited thereto.

The interconnection structure 225 may be disposed between the second substrate 210 and the second front connection pads 232 and the test pads 234, and may be buried in the interlayer insulating layer 221. The interconnection structure 225 may be formed as a multilayer structure including an interconnection pattern and a via, including, for example, aluminum (Al), gold (Au), cobalt (Co), copper (Cu), nickel (Ni), lead (Pb), tantalum (Ta), or tellurium (Te), titanium (Ti), tungsten (W), or a combination thereof, but example embodiments are not limited thereto. A barrier layer (not illustrated) including titanium (Ti), titanium nitride (TiN), tantalum (Ta), or tantalum nitride (TaN) may be disposed between the interconnection pattern or/and the via and the interlayer insulating layer 221. The interconnection structure 225 may connect the individual elements 215 to each other, or may connect the individual elements 215 to the conductive region 213, the second front connection pads 232, and the test pads 234.

The second front connection pads 232 may be disposed below the second circuit layer 220. The second front connection pads 232 may include, for example, at least one of aluminum (Al), copper (Cu), nickel (Ni), tungsten (W), platinum (Pt), or gold (Au), but example embodiments are not limited thereto. The second front connection pads 232 may include a signal pad, a power pad, and a ground pad. The second front connection pads 232 may be disposed to face the first rear connection pads 152. The second front connection pads 232 may be electrically connected to the facing first rear connection pads 152 through the bump structures 235.

The test pads 234 may be disposed adjacently to at least a portion of the second front connection pads 232 on the second front surface FS2. The test pads 234 may be electrically connected to adjacent second front connection pads 232 through the interconnection structure 225. For example, the test pads 234 may be arranged to surround the second front connection pads 232 arranged in a matrix (see FIG. 1C), but example embodiments are not limited thereto. For example, as illustrated in FIG. 1D, in a second semiconductor chip 200' of the modified example, at least a portion of the test pads 234 may be disposed between the second front connection pads 232 arranged in a matrix.

The test pads 234 may include the same or similar material as the second front connection pads 232. The second front connection pads 232 and the test pads 234 may include a seed layer (not illustrated) disposed on the second front surface FS2. The test pads 234 may be arranged to face dummy pads 154 corresponding thereto. The test pads 234 may be pads for EDS test of second front connection pads 232 electrically connected thereto. In the EDS test, when a bump structure is not formed on surfaces of the test pads 234 damaged by probe contact, the test pads 234 may hinder flow of the adhesive film 310, and may cause turbulence during thermo-compression bonding. As a result, a short circuit may occur between the solder parts SP of adjacent bump structures 235 due to unstable flow of the adhesive film 310. In the inventive concepts, the dummy pads 154 protruding toward the test pads 234 may be introduced to control flow of the adhesive film 310 and reduce or prevent a short circuit between the bump structures 235.

The protective layer 231 may cover the second front surface FS2, and may have openings 231H exposing at least a portion of each of the second front connection pads 232 and at least a portion of each of the test pads 234. The protective layer 231 may include an insulating polymer, for example, photosensitive polyimide (PSPI), but example embodiments are not limited thereto. The openings 231H may expose the second front connection pads 232 and the test pads 234. The test pads 234 exposed through the openings 231H may be in contact with at least one of the dummy pads 154 or the adhesive film 310.

The bump structures 235 may be disposed between the first semiconductor chip 100 and the second semiconductor chip 200, and the first rear connection pads 152 and the second front connection pads 232 may be electrically connected to each other. The bump structures 235 may include a pillar portion PP disposed below the second front connection pads 232, and a solder portion SP disposed below the pillar portion PP and contacting the first rear connection pads 152. The pillar portion PP may have a circular column shape or a polygonal column shape. The pillar portion PP may include, for example, at least one of aluminum (Al), copper (Cu), nickel (Ni), tungsten (W), platinum (Pt), or gold (Au). The pillar portion PP may include a seed layer (not illustrated) disposed on the second front connection pads 232. The solder portion SP may include, for example, tin (Sn) or an alloy containing tin (Sn) (e.g., Sn—Ag—Cu).

The adhesive film 310 may be disposed between the first semiconductor chip 100 and the second semiconductor chip 200. The adhesive film 310 may fill a space between the first semiconductor chip 100 and the second semiconductor chip 200, and may surround at least a portion of the first rear connection pads 152, at least a portion of the dummy pads 154, and at least a portion of the bump structures 235. The adhesive film 310 may be in contact with side surfaces of the bump structures 235 and side surfaces of the dummy pads 154. Depending on example embodiments, the adhesive film 310 may fill a space between the dummy pads 154 and the test pads 234, facing each other. The adhesive film 310 may be a non-conductive film (NCF), but is not limited thereto, and may include, for example, any type of polymer film capable of being thermally compressed.

Figure 2A:
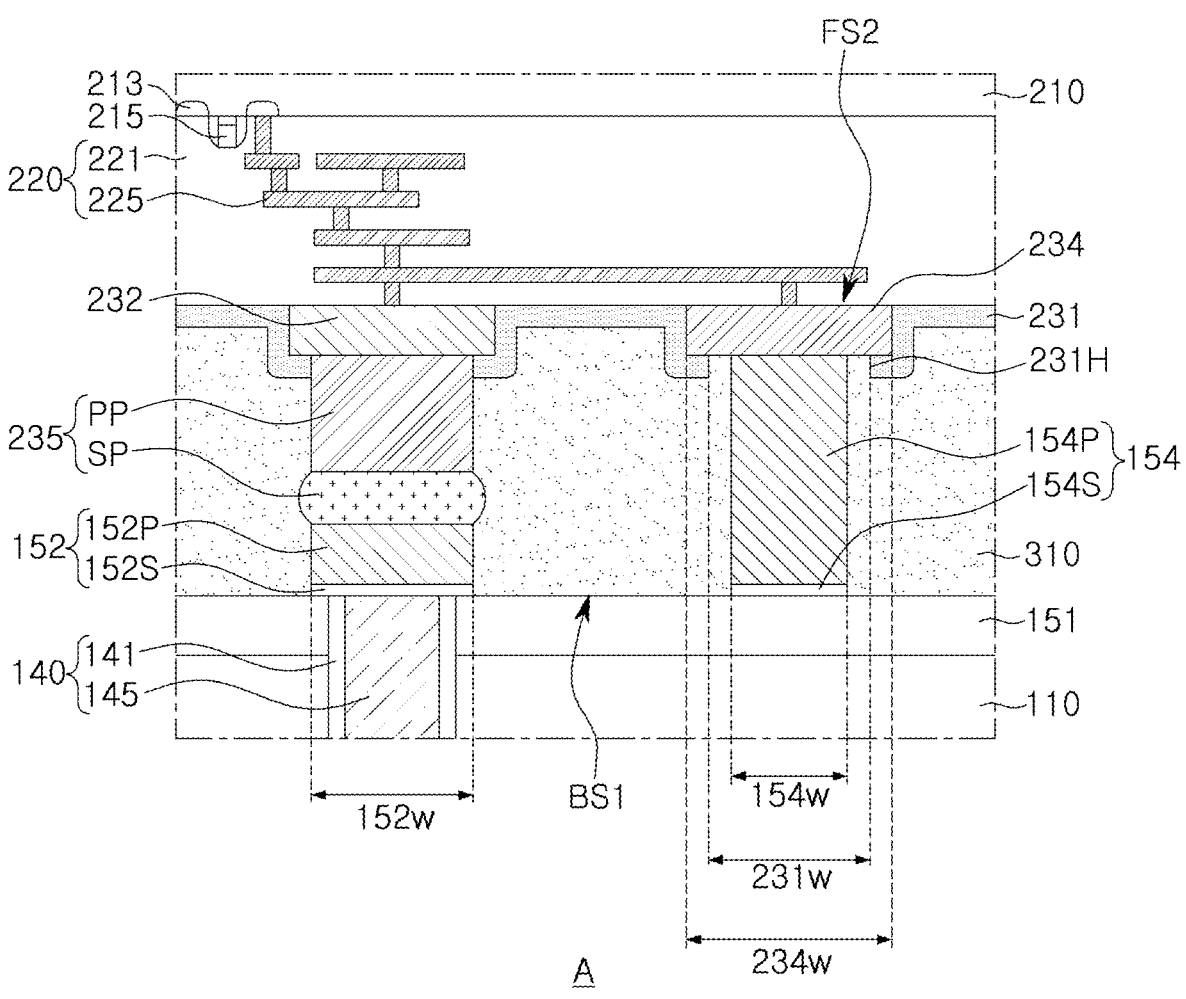
FIGS. 2A to 2C are partially enlarged views illustrating a region corresponding to portion 'A' of FIG. 1A in a second semiconductor chip of a modified example embodiment.
Figure 2B:
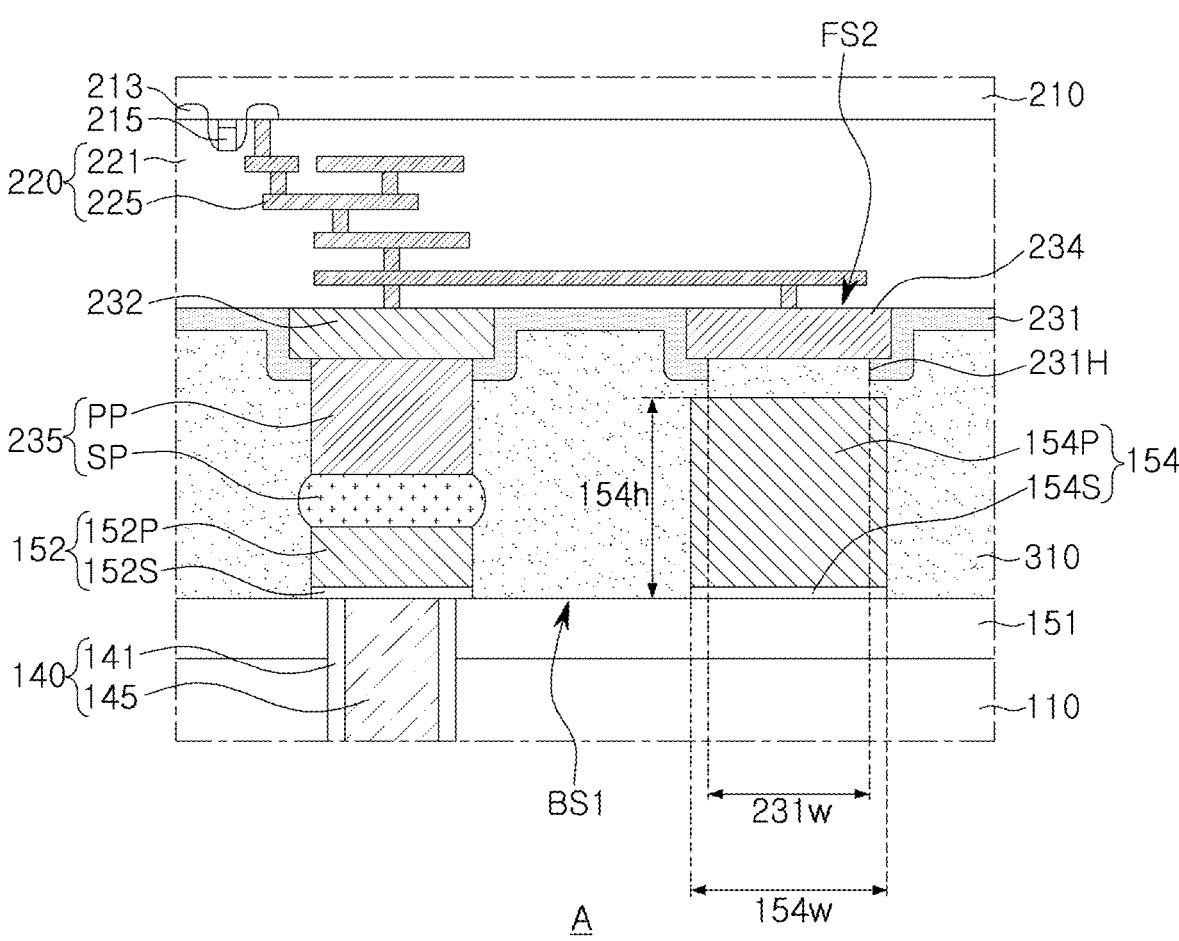
Figure 2C:
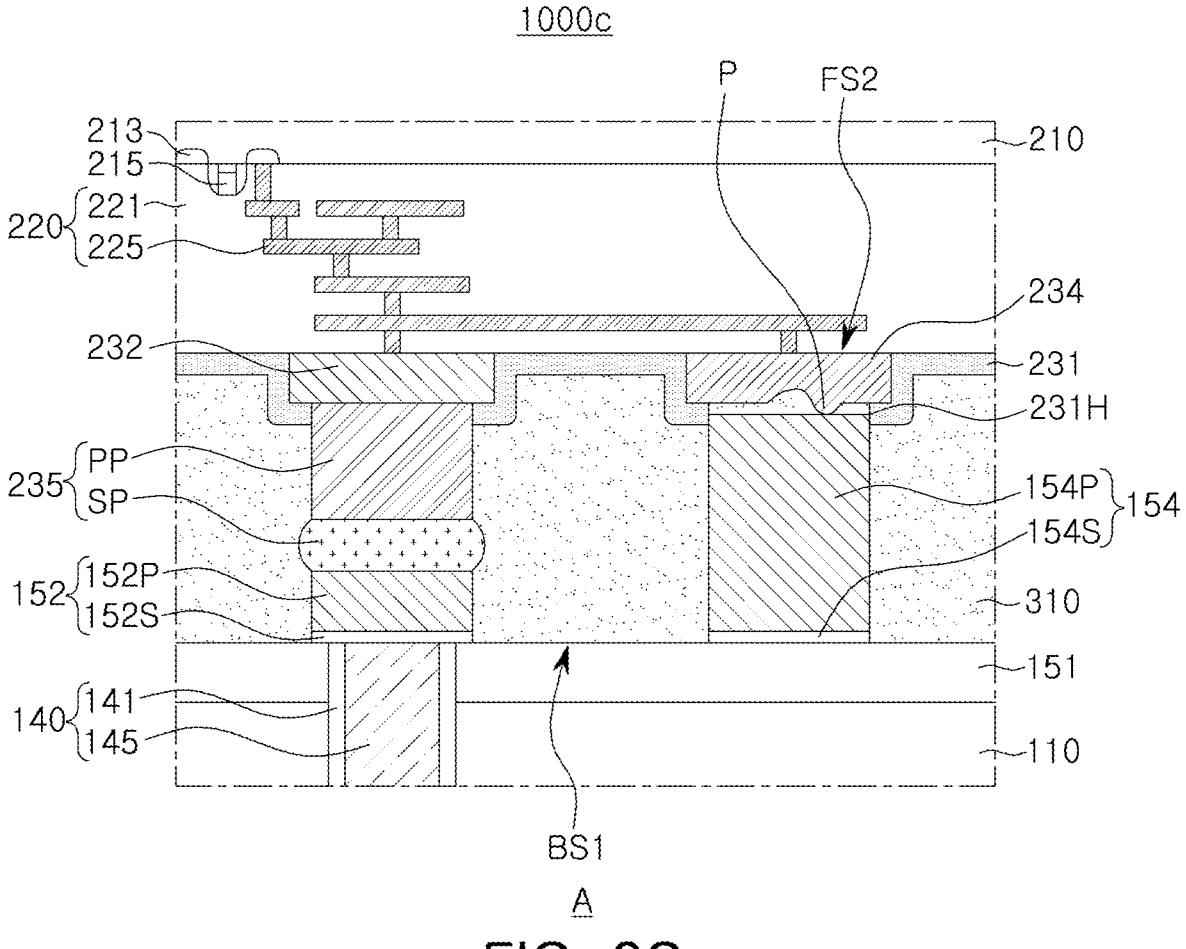

FIGS. 2A to 2C are partially enlarged views illustrating a region corresponding to portion 'A' of FIG. 1A in a second semiconductor chip of a modified example embodiment.

Referring to FIG. 2A, in a semiconductor package 1000a of a modified example embodiment, a width 154w of dummy pads 154 may be different from a width 152w of first rear connection pads 152 and a width 234w of test pads 234. For example, the width 154w of the dummy pads 154 may be narrower than the width 152w of the first rear connection pads 152 and the width 234w of the test pads 234. Depending on example embodiments, the width 154w of the dummy pads 154 may be equal to or wider than the width 152w of the first rear connection pads 152 and/or the width 234w of the test pads 234 (e.g., see FIG. 2B).

Also, the width 154w of the dummy pads 154 may be equal to or narrower than a width 231w of openings 231H through which the test pads 234 are exposed. In some example embodiments, the dummy pads 154 may be in contact with the test pads 234 in the openings 231H. Depending on example embodiments, the dummy pads 154 may not be in contact with the test pad 234.

Referring to FIG. 2B, in a semiconductor package 1000b of a modified example embodiment, dummy pads 154 may have a height 154h that does not contact test pads 234. In some example embodiments, the dummy pads 154 and the test pads 234 may be spaced apart from each other. An adhesive film 310 may fill a space between the dummy pads 154 and the test pads 234.

Referring to FIG. 2C, in a semiconductor package 1000c of a modified example embodiment, test pads 234 may have protrusions P of which surfaces are piled up by contact of probes in an EDS test. Depending on an example embodiment, dummy pads 154 may be in contact with the protrusions P of the test pads 234. In some example embodiments, an adhesive film 310 may fill a space between the test pads 234 and the dummy pads 154. As such, when the test pads 234 are damaged in the EDS test, it may be difficult to form a bump structure on the test pads 234. When the bump structure is not formed on the test pads 234, unstable flow of the adhesive film 310 may occur during thermal-compression bonding. In the inventive concepts, the dummy pads 154 protruding toward the test pads 234 may be introduced to control flow of the adhesive film 310 and reduce or prevent a short circuit between bump structures 235.

Figure 3:
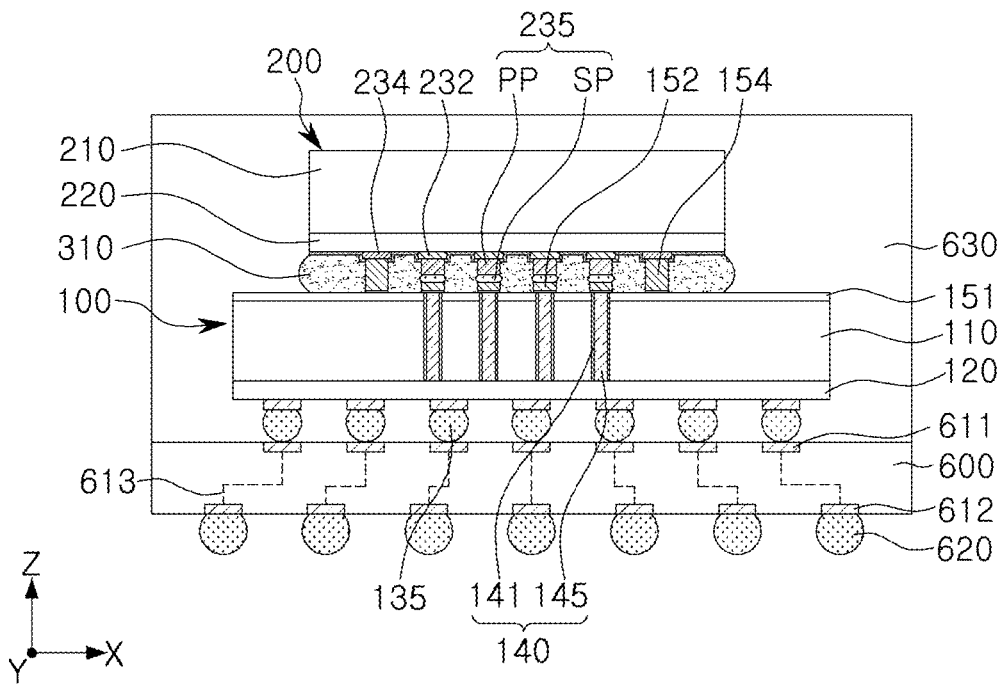
FIG. 3 is a cross-sectional view illustrating a semiconductor package according to an example embodiment.

FIG. 3 is a cross-sectional view illustrating a semiconductor package 1000A according to an example embodiment.

Referring to FIG. 3, a semiconductor package 1000A according to an example embodiment may have the same as or similar characteristics as those described with reference to FIGS. 1A to 2C, except that a package substrate 600 on which a first semiconductor chip 100 is mounted may be further included.

According to some example embodiments, the semiconductor package 1000A may further include an encapsulant 630 encapsulating first and second semiconductor chips 100 and 200 on the package substrate 600. The encapsulant 630 may be formed of, for example, an insulating material such as an epoxy mold compound (EMC), but example embodiments are not limited thereto. Depending on example embodiments, the encapsulant 630 may be formed to expose an upper surface of the second semiconductor chip 200.

The first semiconductor chip 100 may be, for example, a logic chip including a central processor (CPU), a graphics processor (GPU), a field programmable gate array (FPGA), an application processor (AP), a digital signal processor (DSP), an encryption processor, a microprocessor, a micro-controller, an analog-to-digital converter, an application specific integrated circuit (ASIC), or the like. The second semiconductor chip 200 may include a memory chip such as DRAM, SRAM, PRAM, MRAM, FeRAM, or RRAM, but example embodiments are not limited thereto.

The package substrate 600 may include a lower pad 612 disposed on a lower surface of a body, an upper pad 611 disposed on an upper surface of the body, and a redistribution circuit 613 electrically connecting the lower pad 612 and the upper pad 611. The redistribution circuit 613 may form an electrical path connecting a lower surface and an upper surface of the package substrate 600. The package substrate 600 may be a substrate for a semiconductor package including a printed circuit board (PCB), a ceramic substrate, a glass substrate, a tape substrate, or the like. The body of the package substrate 600 may include a different material, depending on a type of substrate. For example, when the package substrate 600 is a printed circuit board, the body may be a body copper-clad laminate or may have a form in which a wiring layer is additionally laminated on one or both surfaces of a copper-clad laminate. Solder resist layers may be formed on the lower and upper surfaces of the package substrate 600. An external connection terminal 620 connected to the lower pad 612 may be disposed below the package substrate 600. The external connection terminal 620 may be formed of a conductive material having a shape such as a ball, a pin, or the like.

Figure 4A:
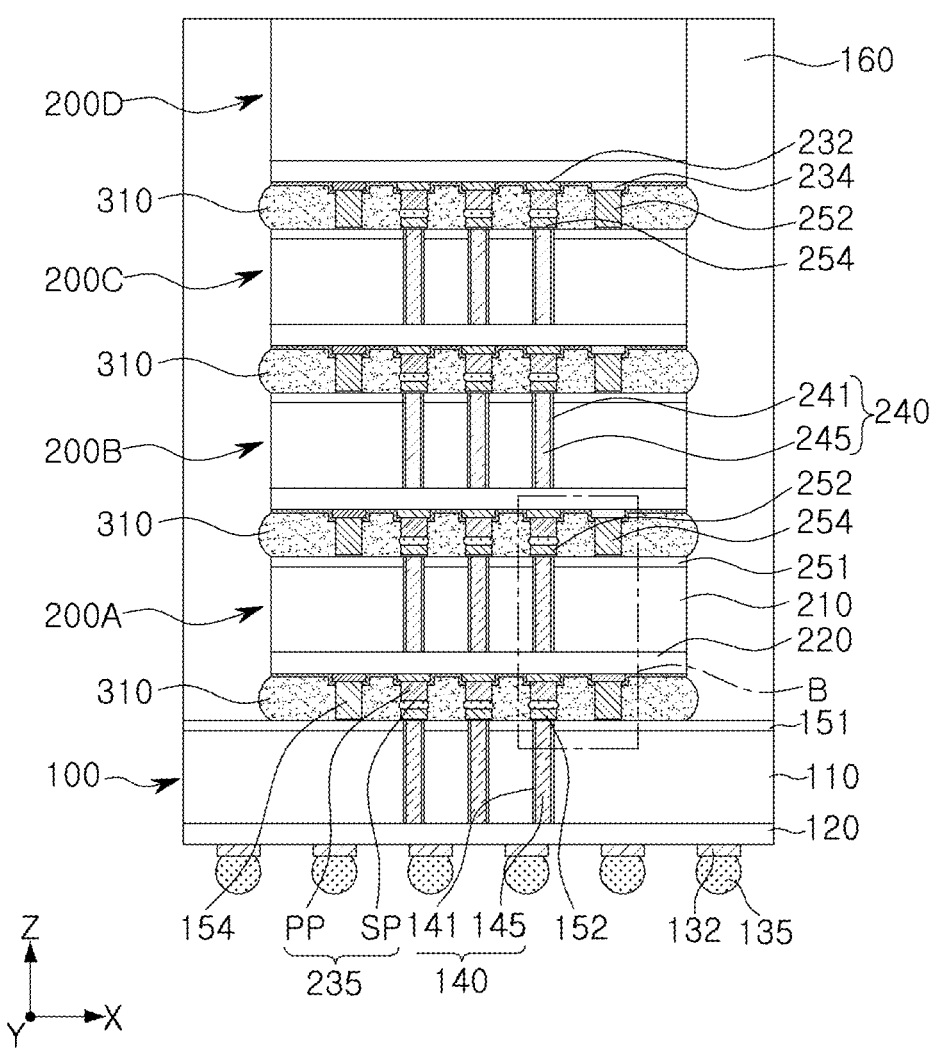
FIG. 4A is a cross-sectional view illustrating a semiconductor package according to an example embodiment.
Figure 4B:
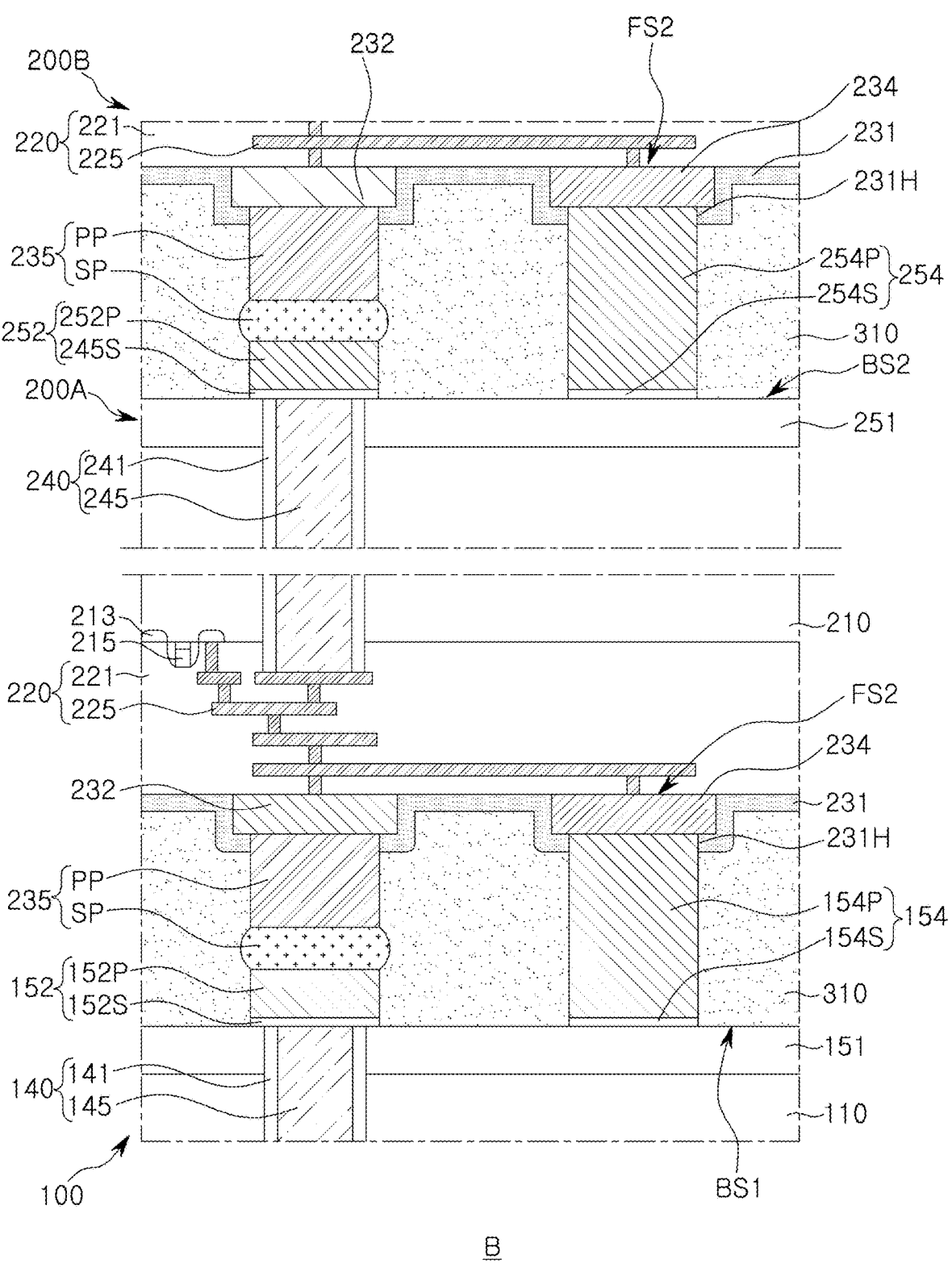
FIG. 4B is a partially enlarged view illustrating portion 'B' of FIG. 4A.

FIG. 4A is a cross-sectional view illustrating a semiconductor package 1000B according to an example embodiment, and FIG. 4B is a partially enlarged view illustrating portion 'B' of FIG. 4A.

Referring to FIGS. 4A and 4B, a semiconductor package 1000B according to an example embodiment may have the same or similar characteristics as those described with reference to FIGS. 1A to 3, except that a plurality of second semiconductor chips 200A, 200B, 200C, and 200D are stacked on a first semiconductor chip 100. The semiconductor package 1000B may further include a mold portion 160 covering the plurality of second semiconductor chips 200A, 200B, 200C, and 200D on the first semiconductor chip 100. The mold portion 160 may expose an upper surface of the second semiconductor chip 200D, which is an uppermost second semiconductor chip, but example embodiments are not limited thereto. The molding unit 160 may be formed using, for example, EMC. The number of the plurality of second semiconductor chips 200A, 200B, 200C, and 200D may not be limited to that illustrated in the drawings, and may be two (2), three (3), or five (5) or more.

The plurality of second semiconductor chips 200A, 200B, 200C, and 200D may include a second substrate 210, a second circuit layer 220, second front connection pads 232, and test pads 234. An adhesive film 310 may be disposed between the plurality of second semiconductor chips 200A, 200B, 200C, and 200D.

The second semiconductor chips 200A, 200B, and 200C between the uppermost second semiconductor chip 200D and the first semiconductor chip 100 may include a second rear surface insulating layer 251, second rear connection pads 252, and second dummy pads 254. The second rear connection pads 252, and second dummy pads 254 may be disposed on a second rear surface BS2. The second rear surface insulating layer 251 may electrically insulate the second rear connection pads 252 and the second dummy pads 254, from a semiconductor material forming the second substrate 210. The second dummy pads 254 may overlap the test pads 234 in the stacking direction and have a height, greater than that of the second rear connection pads 252. The second rear connection pads 252 and the second dummy pads 254 may include seed layers 245S and 254S and plating layers 252P and 254P, respectively. In addition, the second semiconductor chips 200A, 200B, and 200C between the uppermost second semiconductor chip 200D and the first semiconductor chip 100 may include second through-holes 240. The second through-electrodes 240 may have the same or similar characteristics as first through-electrodes 140 of the first semiconductor chip 100. The second through-electrodes may include a second via plug 245 and a second side surface barrier film 241.

For example, the first semiconductor chip 100 may be a buffer chip including a plurality of logic devices and/or a plurality of memory devices. Therefore, the first semiconductor chip 100 may transmit a signal from the plurality of second semiconductor chips 200A, 200B, 200C, and 200D, stacked thereon, from an outside, and may also transmit a signal and power from the outside to the plurality of second semiconductor chips 200A, 200B, 200C, and 200D. The first semiconductor chip 100 may perform both a logic function and a memory function through logic devices and memory devices, but may include only logic devices and perform only a logic function according to some example embodiments. The plurality of second semiconductor chips 200A, 200B, 200C, and 200D may include, for example, a volatile memory chip such as a DRAM or an SRAM, or a non-volatile memory chips such as a PRAM, an MRAM, a FeRAM, or an RRAM, but example embodiments are not limited thereto. The semiconductor package 1000B of this example embodiment may be used for a high bandwidth memory (HBM) product, an electro data processing (EDP) product, or the like.

Figure 5A:
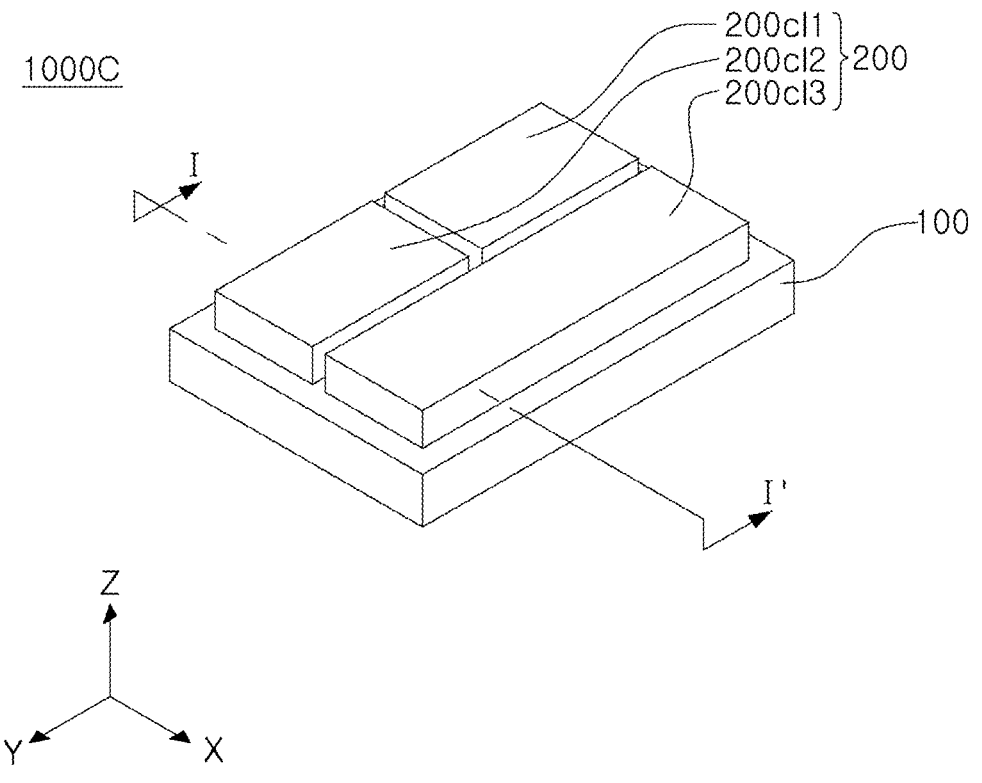
FIG. 5A is a perspective view schematically illustrating a semiconductor package according to an example embodiment.
Figure 5B:
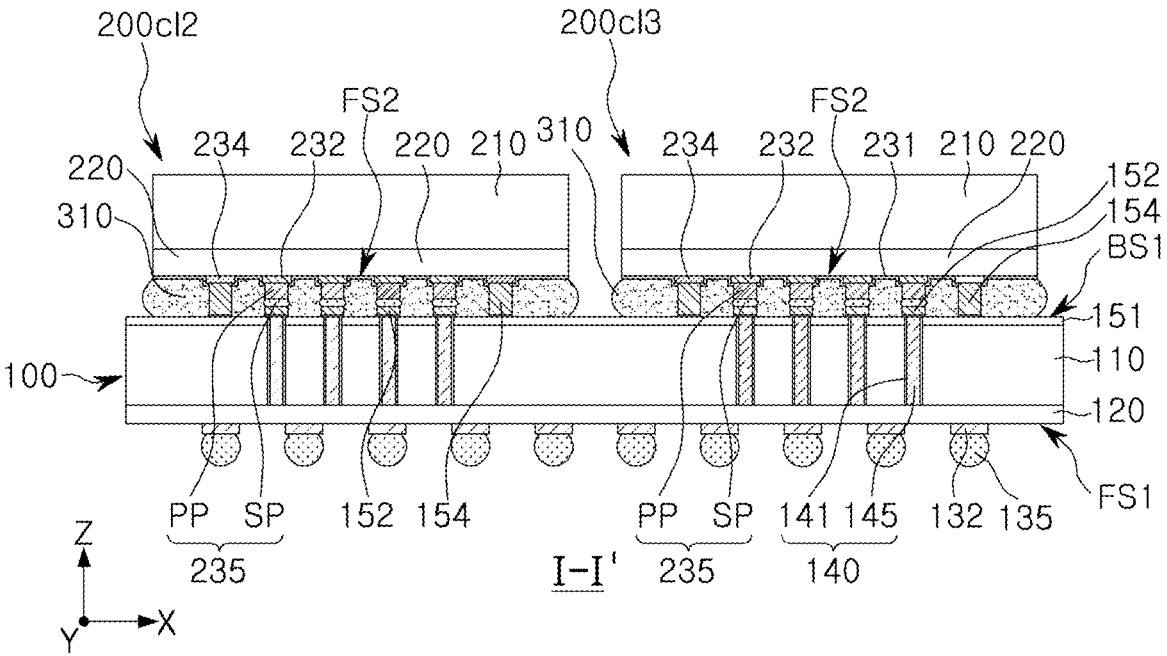
FIG. 5B is a cross-sectional view of FIG. 5A, taken along line I-I'.

FIG. 5A is a perspective view schematically illustrating a semiconductor package 1000C according to an example embodiment, and FIG. 5B is a cross-sectional view of FIG. 5A, taken along line I-I'.

Referring to FIGS. 5A and 5B, a semiconductor package 1000C according to an example embodiment may have the same or similar characteristics as those described with reference to FIGS. 1A to 4B, except that a second semiconductor chip 200 is provided as chiplets 200c11, 200c12, and 200c13, arranged side by side, on a first semiconductor chip 100. According to some example embodiments, the first semiconductor chip 100 may be mounted on the package substrate 300. Each of the chiplets 200c11, 200c12, and 200c13 may include second front connection pads 232 and test pads 234. The first semiconductor chip 100 may include dummy pads 154 corresponding to the test pads 234 of each of the chiplets 200c11, 200c12, and 200c13. An adhesive film 310 may be disposed between the first semiconductor chip 100 and the chiplets 200c11, 200c12, and 200c13.

The chiplets 200c11, 200c12, and 200c13 may mean each chip constituting a multi-chip module (MCM). The MCM may be composed of I/O, CPU, GPU, FPGA chips, or the like. For example, in FIG. 5A, a first chiplet 200c11 may be a GPU chip, a second chiplet 200c12 may be a CPU chip, and a third chiplet 200c13 may be an FPGA chip. The number of chiplets stacked on the first semiconductor chip 100 is not particularly limited. For example, two (2) or less chiplets or four (4) or more chiplets may be mounted on the first semiconductor chip 100. In some example embodiments, the chiplet or chiplet technology may refer to a semiconductor chip manufactured separately according to a size and function of a device, or a technology of manufacturing such a semiconductor chip. The first semiconductor chip 100 may be, for example, an active interposer that performs a function of an I/O chip. The first semiconductor chip 100 may include an I/O device, a DC/DC converter, a sensor, a test circuit, or the like therein. Therefore, the chiplets 200c11, 200c12, and 200c13 and the first semiconductor chip 100 may constitute an MCM.

Figure 6A:
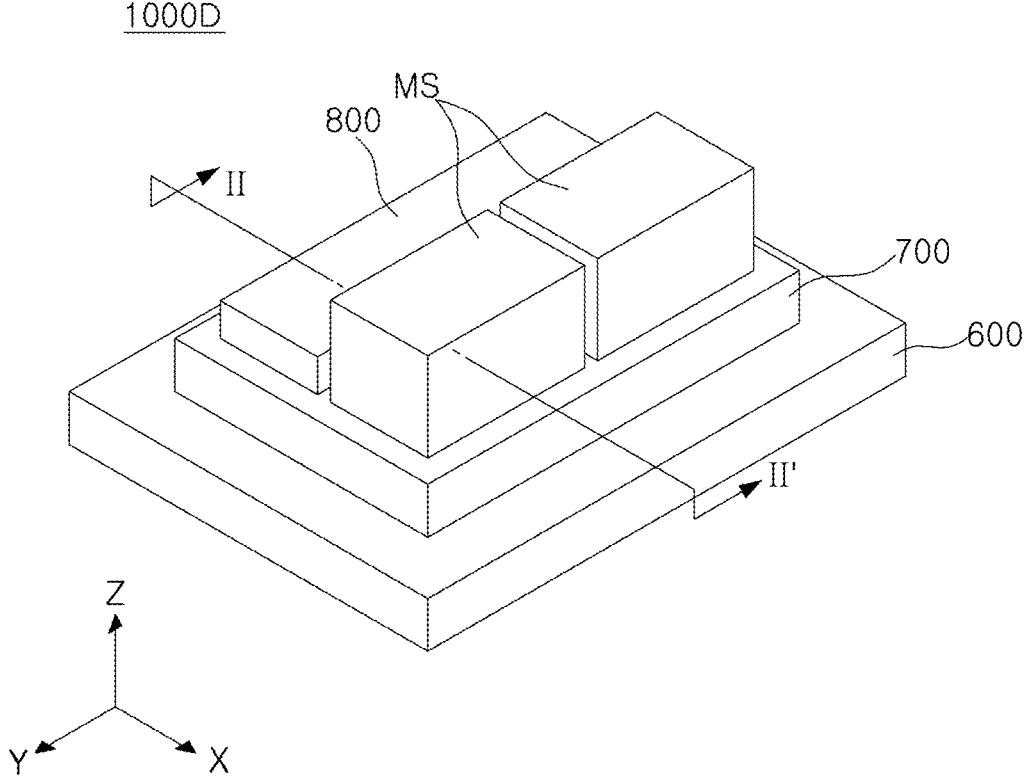
FIG. 6A is a perspective view schematically illustrating a semiconductor package according to an example embodiment.
Figure 6B:
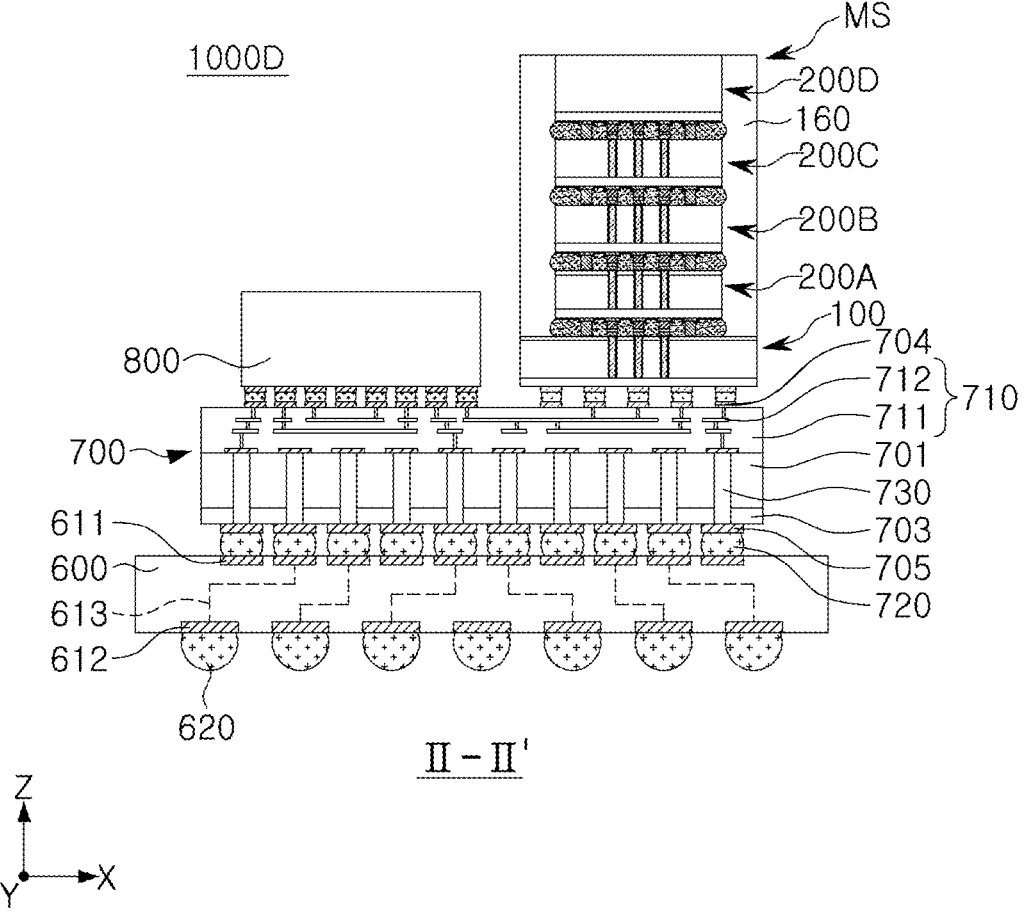
FIG. 6B is a cross-sectional view of FIG. 6A, taken along line II-II'.

FIG. 6A is a perspective view schematically illustrating a semiconductor package 1000D according to an example embodiment, and FIG. 6B is a cross-sectional view of FIG. 6A, taken along line II-II'.

Referring to FIGS. 6A and 6B, a semiconductor package 1000D according to an example embodiment may include a package substrate 600, an interposer substrate 700, at least one multi-chip structure MS, and a processor chip 800. The multi-chip structure MS may have the same or similar characteristics as the semiconductor packages 1000A, 1000B, 1000C, 1000D, 1000a, 1000b, and 1000c described with reference to FIGS. 1A to 5B. As an example, the multi-chip structure MS may have a structure similar to that of the semiconductor package 1000B illustrated in FIGS. 4A and 4B.

The package substrate 600 may be a support substrate on which the interposer substrate 700, the processor chip 800, and the multi-chip structure MS are mounted, and may be a substrate for a semiconductor package including a printed circuit board (PCB), a ceramic substrate, a glass substrate, a tape substrate, or the like.

The interposer substrate 700 may include a substrate layer 701, a lower protective layer 703, an upper pad 704, a lower pad 705, an interconnection structure 710, a metal bump 720, and a through-via 730. The multi-chip structure MS and the processor chip 800 may be electrically connected to each other via the interposer substrate 700.

The substrate layer 701 may be formed of, for example, any one of a silicon substrate, an organic substrate, a plastic substrate, or a glass substrate, but example embodiments are not limited thereto. When the substrate layer 701 is a silicon substrate, the interposer substrate 700 may be referred to as a silicon interposer. Unlike what is illustrated in the drawings, when the substrate layer 701 is an organic substrate, the interposer substrate 700 may be referred to as a panel interposer.

The lower protective layer 703 may be disposed on a lower surface of the substrate layer 701, and the upper pad 704 and the lower pad 705 may be disposed below the lower protective layer 703. The lower pad 705 may be connected to the through-via 730. The multi-chip structure MS and the processor chip 800 may be electrically connected to the package substrate 600 through the through-via 730.

The interconnection structure 710 may be disposed on an upper surface of the substrate layer 701, and may include an interlayer dielectric layer 711 and a single-layer or multi-layer interconnection structure 712. When the interconnection structure 710 has a multilayer interconnection structure, interconnection patterns of different layers may be connected to each other through a contact via.

The through-via 730 may extend from the upper surface to the lower surface of the substrate layer 701, and may pass through the substrate layer 701. Also, the through-via 730 may extend into the interconnection structure 710, and may be electrically connected to interconnections of the interconnection structure 710. When the substrate layer 701 is formed of silicon, the through-via 730 may be referred to as a TSV. Depending on example embodiments, the interposer substrate 700 may include only an interconnection structure therein, and may not include a through-via.

The interposer substrate 700 may be used for the purpose of converting or transferring an input electrical signal between the package substrate 600 and the multi-chip structure MS and the processor chip 800. Therefore, the interposer substrate 700 may not include devices such as an active device, a passive device, or the like. Also, according to some example embodiments, the interconnection structure 710 may be disposed below the through-via 730. For example, a positional relationship between the interconnect structure 710 and the through-via 730 may be relative.

The metal bump 720 may electrically connect the interposer substrate 700 and the package substrate 600. The multi-chip structure MS may be electrically connected to the metal bump 720 through the interconnections of the interconnection structure 710 and the through-via 730. Depending on an embodiment, lower pads 705 used for power or ground may be integrated to be connected to the metal bumps 720, such that the number of lower pads 705 is greater than the number of metal bumps 720.

The processor chip 800 may include, for example, a central processor (CPU), a graphics processor (GPU), a field programmable gate array (FPGA), a digital signal processor (DSP), a cryptographic processor, a microprocessor, a microcontroller, an analog-digital converter, an application specific integrated circuit (ASIC), or the like.

According to some example embodiments, the semiconductor package 1000D may further include an internal encapsulant (not illustrated) covering the multi-chip structure MS and the processor chip 800 on the interposer substrate 700. In addition, the semiconductor package 1000D may further include an external encapsulant (not illustrated) covering the interposer substrate 700 and the internal encapsulant (not illustrated) on the package substrate 600. The external encapsulant (not illustrated) and the internal encapsulant (not illustrated) may be formed together and not distinguished. According to some example embodiments, the semiconductor package 1000D may further include a heat dissipation structure covering the multi-chip structure MS and the processor chip 800.

FIGS. 7A to 7G are cross-sectional views schematically illustrating a process of manufacturing a semiconductor package according to an example embodiment.

Figure 7A:
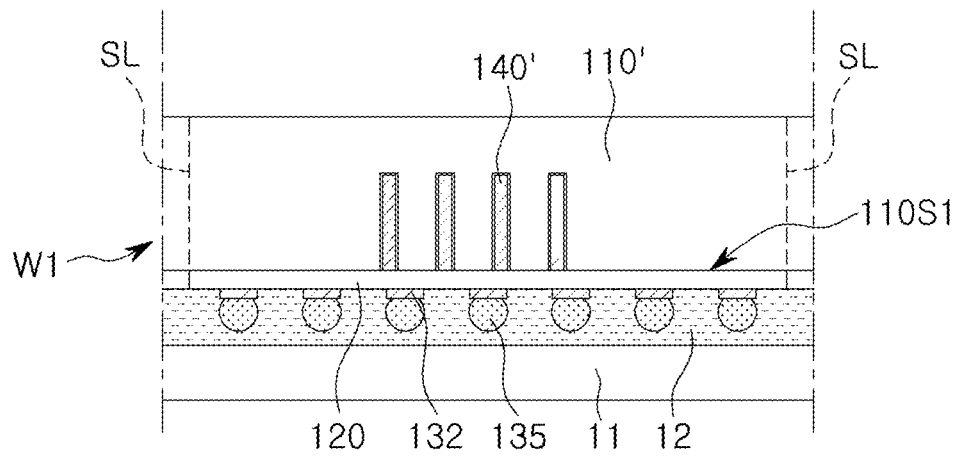
FIGS. 7A to 7G are cross-sectional views schematically illustrating a process of manufacturing a semiconductor package according to an example embodiment.

Referring to FIG. 7A, a semiconductor wafer W1 in which a circuit layer 120, first front connection pads 132, and connection bumps 135, for first semiconductor chips, are formed may be prepared below an active surface 110S1 of a preliminary substrate 110'. The semiconductor wafer W1 may include preliminary through-electrodes 140' disposed in chip regions separated by a scribe line SL. A carrier substrate 11 may be disposed below the semiconductor wafer W1 to support and handle the semiconductor wafer W1 during subsequent processes. The semiconductor wafer W1 may be temporarily fixed and supported on the carrier substrate 11 by an adhesive layer 12.

Figure 7B:
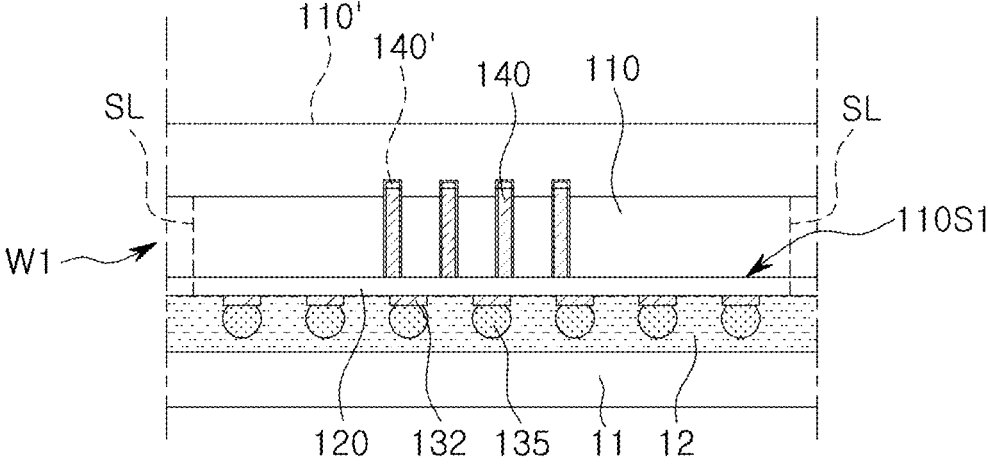

Referring to FIG. 7B, a polishing process may be applied to the semiconductor wafer W1 to remove a portion of the preliminary substrate 110' and/or a portion of the preliminary through-electrodes 140'. A polishing process may be applied to an upper portion of the preliminary substrate 110' to form a first substrate 110 having a desired thickness. The first substrate 110 may be formed to a thickness in which a portion of through-electrodes 140 protrudes. A portion of the preliminary through-electrodes 140' may be removed by the polishing process, to form the through-electrodes 140. As the polishing process, a chemical mechanical polishing (CMP) process, an etch-back process, or a combination thereof may be used. For example, the through-electrodes 140 may be sufficiently exposed by reducing the preliminary substrate 110' to a certain thickness by performing a CMP process and applying an etch-back under appropriate conditions.

Figure 7C:
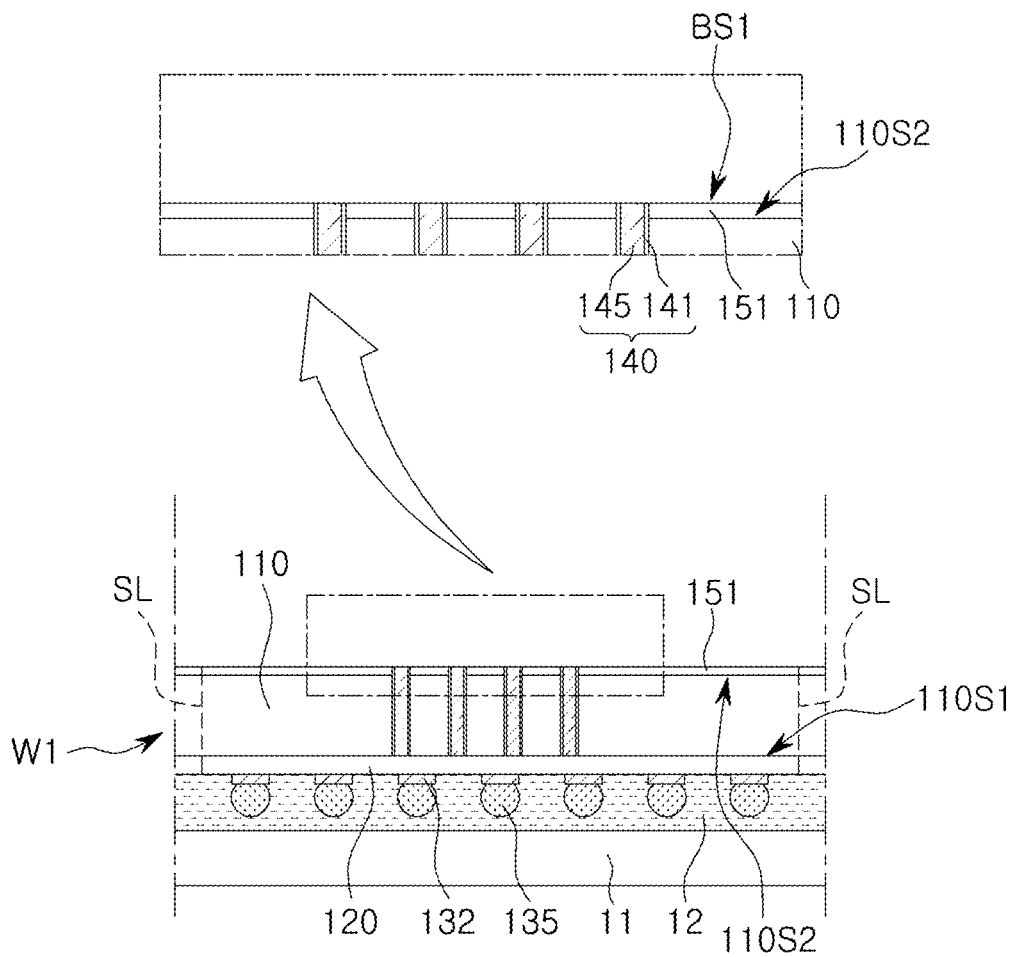

Referring to FIG. 7C, a rear surface insulating layer 151 surrounding upper portions of the through-electrodes 140 may be formed. The rear surface insulating layer 151 may include silicon oxide, silicon nitride, or silicon oxynitride, but example embodiments are not limited thereto. The rear surface insulating layer 151 may be formed using a PVD process or a CVD process. The rear surface insulating layer 151 may provide a first rear surface BS1 by a planarization process (e.g., grinding). Through the planarization process, portions of upper ends of the through-electrodes 140 may also be removed. Therefore, portions of the through-electrodes 140 may be exposed on the first rear surface BS1.

Figure 7D:
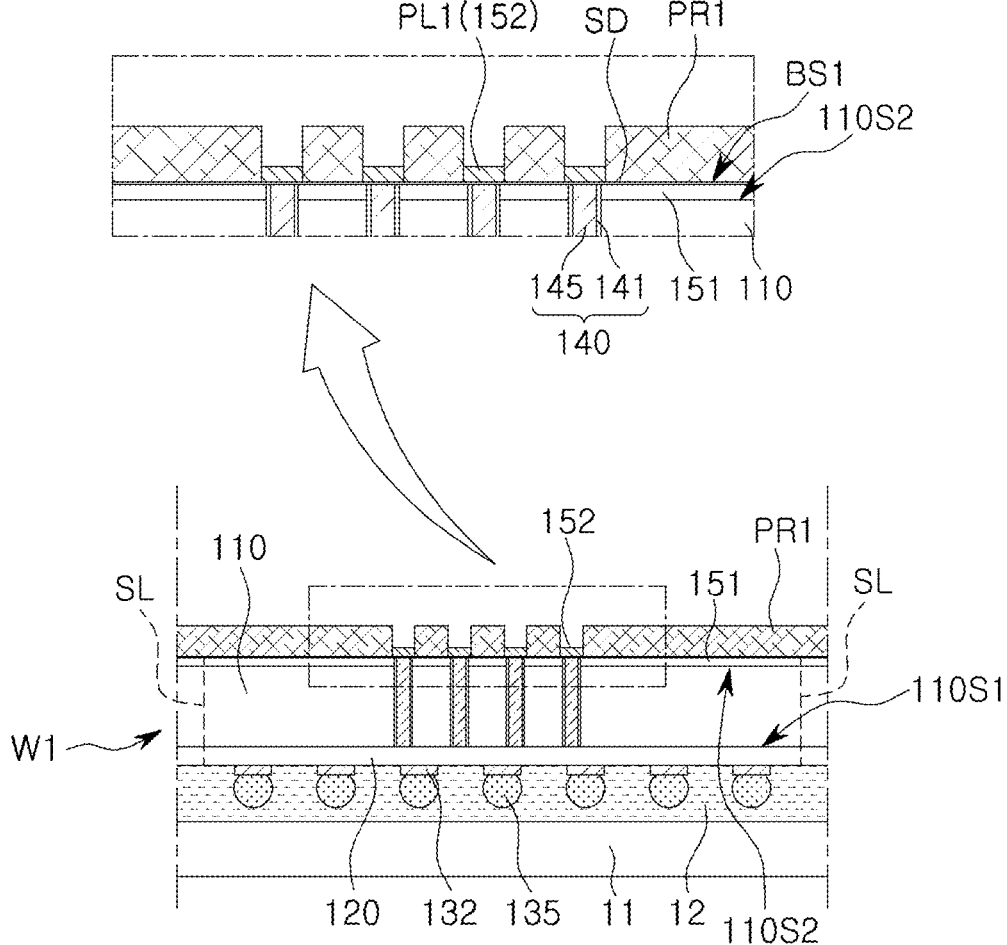

Referring to FIG. 7D, a seed material layer SD and a first plating material layer PL1 may be formed on the first rear surface BS1. The seed material layer SD and the first plating material layer PL1 may be formed using a plating process, a PVD process, or a CVD process. The seed material layer SD may include a barrier layer formed of at least one of titanium (Ti), titanium nitride (TiN), tantalum (Ta), or tantalum nitride (TaN), and a metal layer formed of at least one of copper (Cu), nickel (Ni), gold (Au), or silver (Ag). The first plating material layer PL1 may include at least one of copper (Cu), nickel (Ni), gold (Au), or silver (Ag). The first plating material layer PL1 may be formed using a first photosensitive material layer PR1, which is patterned. The first plating material layer PL1 may correspond to the first rear connection pads 152 described above. After that, the first photosensitive material layer PR1 may be removed.

Figure 7E:
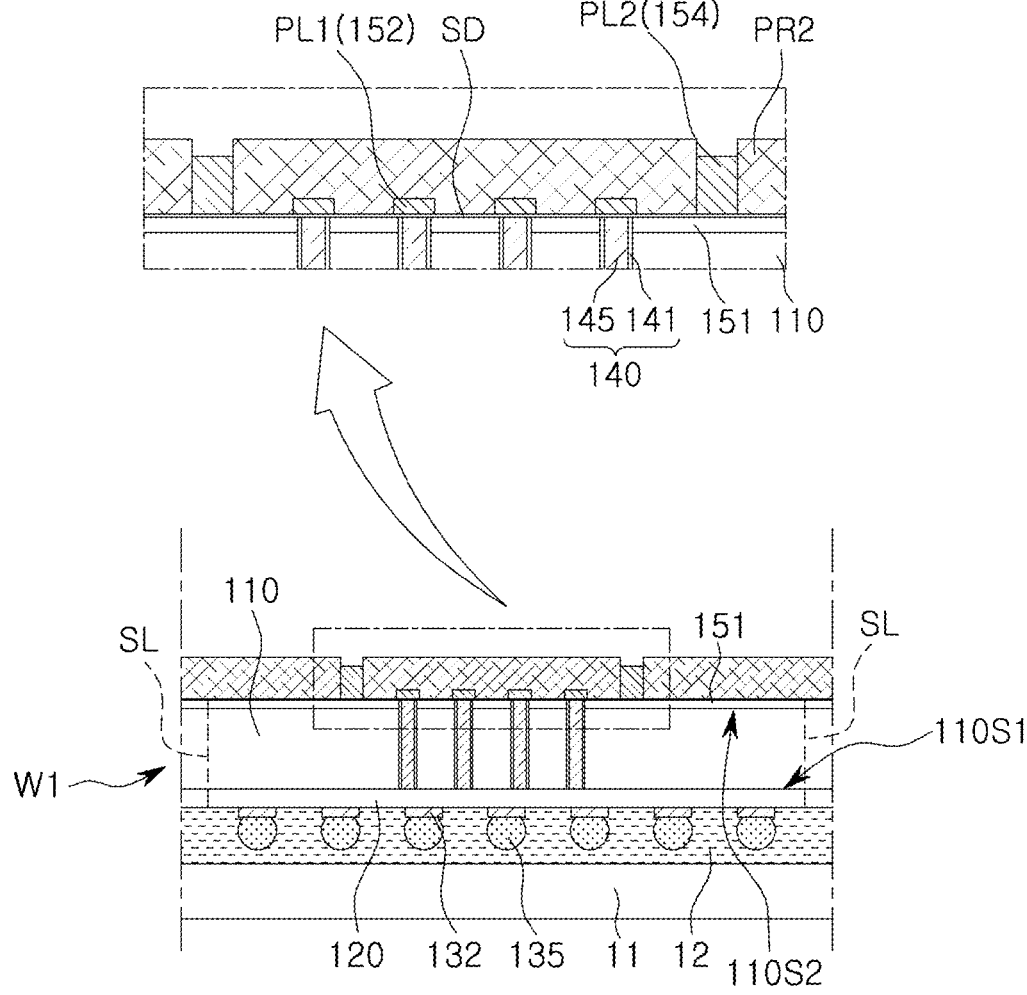

Referring to FIG. 7E, a second plating material layer PL2 may be formed using a second photosensitive material layer PR2, which is patterned. The second plating material layer PL2 may be formed using a plating process, a PVD process, or a CVD process. The second plating material layer PL2 may include at least one of copper (Cu), nickel (Ni), gold (Au), or silver (Ag). The second plating material layer PL2 may be formed to have a height, greater than that of the first plating material layer PL1. The second plating material layer PL2 may correspond to the dummy pads 154 described above. Thereafter, a portion of the seed material layer SD exposed from the second photosensitive material layer PR2 and the first and second plating material layers PL1 and PL2 may be removed.

Figure 7F:
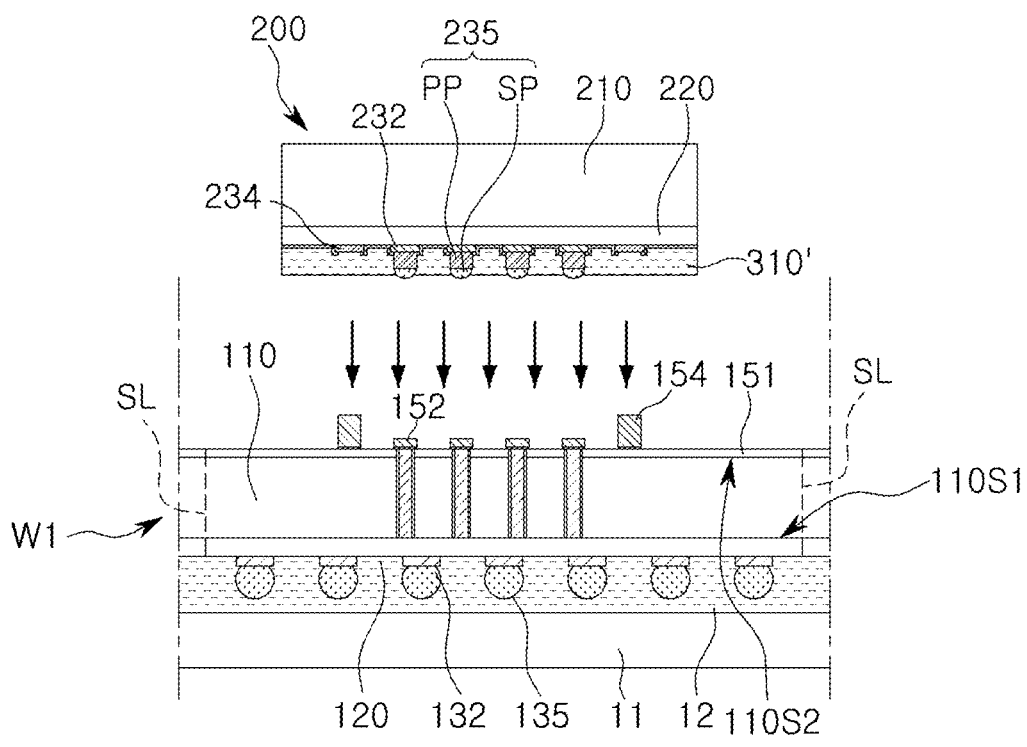

Referring to FIG. 7F, a second semiconductor chip 200 may be disposed on a semiconductor wafer W1. The second semiconductor chip 200 may be vacuum suctioned by a bonding device, and may be picked and disposed on the semiconductor wafer W1. A preliminary adhesive film 310' covering test pads 234 and bump structures 235 may be attached to a lower portion of the second semiconductor chip 200. The second semiconductor chip 200 may be located on the semiconductor wafer W1 such that the test pads 234 may be vertically aligned with dummy pads 154. The bump structures 235 may be formed on second front connection pads 232, and may not be formed on the test pads 234. Traces caused by contact of a probe after an EDS test may be present on at least some surfaces of the test pads 234.

Figure 7G:
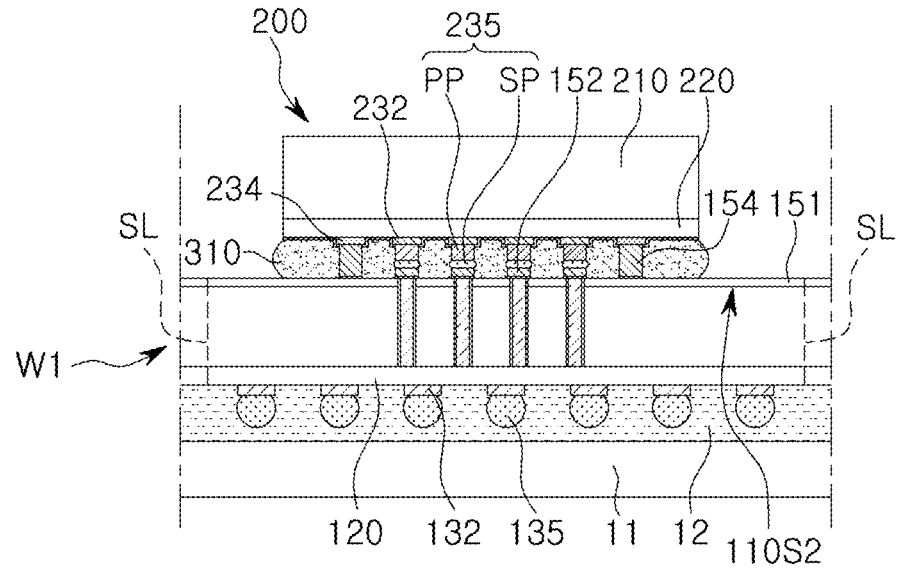

Referring to FIG. 7G, the second semiconductor chip 200 may be mounted on the semiconductor wafer W1 by performing a thermal-compression bonding process. An adhesive film 310 surrounding the dummy pads 154 and the bump structures 235 may be formed by a heat-compression process. According to some example embodiments, the dummy pads 154 protruding toward the test pads 234 may be formed on the semiconductor wafer W1, to control unstable flow of the adhesive film 310 in a heat-compression process, and reduce or prevent a short circuit between the bump structures 235.

According to some example embodiments, dummy pads adjacently to bump structures may be introduced to reduce or prevent a short circuit between the bump structures, to provide a semiconductor package having improved reliability.

One or more of the elements disclosed above may include or be implemented in one or more processing circuitries such as hardware including logic circuits; a hardware/ software combination such as a processor executing software; or a combination thereof. For example, the processing circuitries more specifically may include, but is not limited to, a central processing unit (CPU), an arithmetic logic unit (ALU), a digital signal processor, a microcomputer, a field programmable gate array (FGPA), a System-on-Chip (SoC), a programmable logic unit, a microprocessor, application-specific integrated circuit (ASIC), etc.

While some example embodiments have been illustrated and described above, it will be apparent to those skilled in the art that modifications and variations could be made without departing from the scope of the inventive concepts.

What is claimed is:

1. A semiconductor package comprising:
   a first semiconductor chip including a first front surface and a first rear surface opposite to each other, the first semiconductor chip including first front connection pads on the first front surface, first rear connection pads and dummy pads adjacent to each other on the first rear surface, and through-electrodes electrically connecting at least some of the first front connection pads with at least some of the first rear connection pads;
   a second semiconductor chip including a second front surface facing the first rear surface, the second semiconductor chip including second front connection pads and test pads adjacent to each other on the second front surface, and a protective layer including openings exposing at least a portion of each of the second front connection pads and the test pads;
   bump structures between the first semiconductor chip and the second semiconductor chip, the bump structures electrically connecting the first rear connection pads and the second front connection pads; and
   an adhesive film surrounding at least a portion of each of the first rear connection pads, at least a portion of each of the dummy pads, and at least a portion of each of the bump structures, the adhesive film between the first semiconductor chip and the second semiconductor chip, wherein,
      the dummy pads overlap the test pads in a direction perpendicular to the first rear surface, and
      a height of the dummy pads is greater than a height of the first rear connection pads.

2. The semiconductor package of claim 1, wherein the dummy pads and the first rear connection pads each include,
   a seed layer on the first rear surface, and
   a plating layer on the seed layer.

3. The semiconductor package of claim 1, wherein each of the dummy pads has a width equal to or narrower than a width of each of the openings exposing the test pads.

4. The semiconductor package of claim 3, wherein the dummy pads are in contact with the test pads in the openings.

5. The semiconductor package of claim 1, wherein the dummy pads and the test pads are spaced apart from each other.

6. The semiconductor package of claim 5, wherein the adhesive film is between the dummy pads and the test pads.

7. The semiconductor package of claim 1, wherein each of the test pads includes a protrusion.

8. The semiconductor package of claim 7, wherein
   each of the dummy pads is in contact with the protrusion of a corresponding one of the test pads, and
   the adhesive film is between each of the test pads and each of the dummy pads.

9. The semiconductor package of claim 1, wherein each of the bump structures comprises,
   a pillar portion below a corresponding one of the second front connection pads, and a solder portion below the pillar portion, the solder portion contacting a corresponding one of the first rear connection pads.

10. The semiconductor package of claim 1, wherein a height of each of the dummy pads is equal to or greater than a height of each of the bump structures.

11. The semiconductor package of claim 1, wherein a height of each of the dummy pads is in a range from 20 μm to 50 μm.

12. The semiconductor package of claim 1, wherein the test pads are electrically connected to adjacent second front connection pads.

13. The semiconductor package of claim 1, further comprising a plurality of connection bumps below the first front connection pads of the first semiconductor chip.

14. A semiconductor package comprising:

a first semiconductor chip including first rear connection pads, dummy pads adjacent to at least some of the first rear connection pads, and through-electrodes electrically connected to the first rear connection pads;

a second semiconductor chip on the first semiconductor chip, the second semiconductor chip including second front connection pads facing the first rear connection pads, and test pads facing the dummy pads;

bump structures electrically connecting the first rear connection pads and the second front connection pads; and an adhesive film filling a space between the first semiconductor chip and the second semiconductor chip, wherein an interval between each of the dummy pads and each of the test pads facing each other, is shorter than an interval between each of the first rear connection pads and each of the second front connection pads facing each other.

15. The semiconductor package of claim 14, wherein the adhesive film surrounds a side surface of each of the bump structures and a side surface of each of the dummy pads.

16. The semiconductor package of claim 14, wherein the second semiconductor chip further comprises a protective layer covering a front surface, and the second front connection pads and the test pads are on the front surface, and the protective layer includes openings exposing at least a portion of each of the second front connection pads and at least a portion of each of the test pads.

17. The semiconductor package of claim 16, wherein the test pads exposed through the openings are in contact with at least one of the dummy pads or the adhesive film.

18. A semiconductor package comprising:

a first semiconductor chip including first rear connection pads, dummy pads adjacent to at least some of the first rear connection pads, and through-electrodes electrically connected to the first rear connection pads;

a second semiconductor chip on the first semiconductor chip, the second semiconductor chip including second front connection pads facing the first rear connection pads, and test pads facing the dummy pads;

bump structures electrically connecting the first rear connection pads and the second front connection pads facing each other; and an adhesive film surrounding at least a portion of each of the dummy pads and at least a portion of each of the bump structures, the adhesive film between the first semiconductor chip and the second semiconductor chip, wherein upper surfaces of the dummy pads are higher than upper surfaces of the first rear connection pads.

19. The semiconductor package of claim 18, wherein each of the bump structures comprises a pillar portion below a corresponding one of the second front connection pads, and a solder portion below the pillar portion, the solder portion contacting a corresponding one of the first rear connection pads, and the upper surfaces of the dummy pads are higher than a boundary surface between the pillar portion and the solder portion.

20. The semiconductor package of claim 18, wherein the upper surfaces of the dummy pads are in contact with at least one of the adhesive film or the test pads.

* * * * *